(12) United States Patent
Matsushita

(10) Patent No.: US 7,167,386 B2
(45) Date of Patent: Jan. 23, 2007

(54) FERROELECTRIC MEMORY AND OPERATING METHOD THEREFOR

(75) Inventor: Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 136 days.

(21) Appl. No.: 10/304,691

(22) Filed: Nov. 27, 2002

(65) Prior Publication Data

US 2003/0103372 A1 Jun. 5, 2003

(30) Foreign Application Priority Data

Nov. 30, 2001 (JP) ........................... 2001-366527

(51) Int. Cl.
*G11C 11/22* (2006.01)

(52) U.S. Cl. ........................ 365/145; 365/228
(58) Field of Classification Search ............. 365/145, 365/228

See application file for complete search history.

(56) References Cited

U.S. PATENT DOCUMENTS

| | | | | |
|---|---|---|---|---|
| 5,478,610 A | * | 12/1995 | Desu et al. ............... | 427/573 |
| 5,621,680 A | * | 4/1997 | Newman et al. ........... | 365/145 |
| 5,666,305 A | | 9/1997 | Mihara et al. | |
| 5,986,919 A | * | 11/1999 | Allen et al. ............... | 365/145 |

FOREIGN PATENT DOCUMENTS

| | | | |
|---|---|---|---|
| JP | 03-108769 | | 5/1991 |
| JP | 04-171758 | | 6/1992 |
| JP | 7-106450 | | 4/1995 |
| JP | 07-106450 | * | 4/1995 |
| JP | 9-91970 | | 4/1997 |

OTHER PUBLICATIONS

Office Action and English translation of Office Action for Japanese Application No. 2001–36657, dated Aug. 1, 2005.

Partial English Translation of JP4–171758, issued Jul. 18, 1992 in Japan.

Partial English Translation of JP3–108769 issued May 8, 1991 in Japan.

Partial English Translation of JP7–106450 issued Apr. 21, 1995 in Japan.

* cited by examiner

*Primary Examiner*—Michael Tran
(74) *Attorney, Agent, or Firm*—Arent Fox PLLC

(57) ABSTRACT

A ferroelectric memory capable of improving disturbance resistance in a non-selected cell by increasing the ratio between voltages applied to ferroelectric capacitors of a selected cell and the non-selected cell respectively is obtained. This ferroelectric memory comprises a bit line, a word line arranged to intersect with the bit line and a memory cell including a switching element arranged between the bit line and the word line and turned on with a threshold voltage having a substantially identical absolute value with respect to either of positive and negative voltage application directions and a ferroelectric capacitor arranged between the bit line and the word line and serially connected to the switching element.

18 Claims, 13 Drawing Sheets

| | SELECTED CELL | NON-SELECTED CELL | VOLTAGE APPLIED TO FERROELECTRIC CAPACITOR (NON-SELECTED CELL/ SELECTED CELL) |
|---|---|---|---|
| SECOND EMBODIMENT |  |  | 0.2V/2.2V |
| PRIOR ART |  |  | 0.73V/2.2V |

FIG.12

| | SELECTED CELL | NON-SELECTED CELL | VOLTAGE APPLIED TO FERROELECTRIC CAPACITOR (NON-SELECTED CELL/ SELECTED CELL) |
|---|---|---|---|
| THIRD EMBODIMENT | 51 3.8V<br>52 0.8V<br>53 2.0V<br>54 1.0V | 51 1.27V<br>52 0.8V<br>53 0.31V<br>54 0.16V | 0.31V/2.0V |
| PRIOR ART | 3.0V<br>2.0V<br>1.0V | 1.0V<br>0.67V<br>0.33V | 0.67V/2.0V |

FERROELECTRIC MEMORY AND OPERATING METHOD THEREFOR

BACKGROUND OF THE INVENTION

1. Field of the Invention

The present invention relates to a ferroelectric memory and an operating method therefor, and more particularly, it relates to a ferroelectric memory having a ferroelectric capacitor and an operating method therefor.

2. Description of the Background Art

A ferroelectric memory has recently been watched with interest as a high-speed nonvolatile memory having low power consumption. Therefore, the ferroelectric memory is actively researched and developed.

FIG. 13 is a typical circuit diagram of a most generally employed conventional ferroelectric memory, and FIG. 14 is a sectional view of the ferroelectric memory shown in FIG. 13. Referring to FIGS. 13 and 14, element isolation regions 102 are formed on prescribed regions of the surface of a semiconductor substrate 101 in the structure of the conventional ferroelectric memory. Source regions 103 and a drain region 104 are formed on an element forming region enclosed with the element isolation regions 102 at prescribed intervals. Gate electrodes 106 forming word lines $WL_0$ and $WL_1$ are provided on channel regions located between the source regions 103 and the drain region 104. A bit line $BL_0$ is electrically connected to the drain region 104.

Lower electrodes 109 are formed on the source regions 103 through plug electrodes 108. Upper electrodes 111 forming plate lines $PL_0$ and $PL_1$ are formed on the lower electrodes 109 through ferroelectric layers 110. The lower electrodes 109, the ferroelectric layers 110 and the upper electrodes 111 form ferroelectric capacitors 112. The source regions 103, the drain region 104 and the gate electrodes 106 form transistors 107. The transistors 107 function as switches for selecting memory cells 100. As shown in FIG. 13, each memory cell 100 is formed by a single transistor 107 and a single ferroelectric capacitor 112.

In the structure of the conventional ferroelectric memory shown in FIGS. 13 and 14, however, each memory cell 100 formed by the single transistor 107 and the single ferroelectric capacitor 112 disadvantageously requires a relatively large area.

In this regard, there has generally been developed a simple matrix ferroelectric memory having memory cells each formed by only a single ferroelectric capacitor or an MFIS-FET (metal ferroelectric insulator semiconductor-field effect transistor) or MFMIS-FET (metal ferroelectric metal insulator semiconductor-field effect transistor) ferroelectric memory having ferroelectric capacitors formed on gate portions of transistors.

FIG. 15 is a circuit diagram of a conventional simple matrix ferroelectric memory, and FIG. 16 is a sectional view of the simple matrix ferroelectric memory shown in FIG. 15. Referring to FIGS. 15 and 16, a ferroelectric layer 202 is formed on each bit line (BL) 201. Word lines (WL) 203 are formed on the ferroelectric layer 202 in a direction intersecting with the bit line 201. The bit line 201, the ferroelectric layer 202 and each word line 203 form a ferroelectric capacitor 210. In this simple matrix ferroelectric memory, each memory cell 200 is formed by only a single ferroelectric capacitor 210, as shown in FIG. 15.

FIG. 17 is a circuit diagram for illustrating exemplary voltage application according to a ½ Vcc method in a write operation of the conventional simple matrix ferroelectric memory, and FIG. 18 is a circuit diagram for illustrating exemplary voltage application according to a ⅓ Vcc method in the write operation of the conventional simple matrix ferroelectric memory.

Referring to FIG. 17, a power supply voltage Vcc is applied between a bit line $BL_1$ and a word line $WL_1$ connected with a selected memory cell (selected cell) for driving the selected cell according to the ½ Vcc method. In other words, the power supply voltage Vcc is applied to the bit line $BL_1$ while a voltage of 0 V is applied to the word line $WL_1$. Further, a voltage of 0 V is applied to bit lines $BL_0$ and $BL_2$ connected with non-selected memory cells (non-selected cells) and a voltage of ½ Vcc is applied to word lines $WL_0$ and $WL_2$ connected with the non-selected cells. Thus, the power supply voltage Vcc is applied to the selected cell while the voltage of ½ Vcc is applied to the non-selected cells.

Referring to FIG. 18, the power supply voltage Vcc is applied to the bit line $BL_1$ while a voltage of 0 V is applied to the word line $WL_1$ according to the ⅓ Vcc method. Further, a voltage of ⅓ Vcc is applied to the bit lines $BL_0$ and $BL_2$ connected with the non-selected memory cells (non-selected cells) and a voltage of ⅔ Vcc is applied to the word lines $WL_0$ and $WL_2$ connected with the non-selected cells. Thus, the power supply voltage Vcc is applied to the selected cell while the voltage of ⅓ Vcc is applied to the non-selected cells.

In the aforementioned case, it is necessary that polarization inversion can be sufficiently saturated with respect to the ferroelectric layer 202 (see FIG. 16) of the selected cell while polarized states remain substantially unchanged with respect to ferroelectric layers of the non-selected cells.

Under present conditions, however, the angular shape of a ferroelectric hysteresis is so insufficient that information (quantity of charges) is lost by the so-called disturbance when the voltage of ½ Vcc or ⅓ Vcc is unidirectionally continuously applied to the non-selected cells, as shown in FIG. 19. Information written in the non-selected cells is lost due to such disturbance, and hence it is difficult to use the memory as a ferroelectric memory in this case. At present, therefore, it is regarded as difficult to put the simple matrix ferroelectric memory shown in FIGS. 15 and 16 into practice.

FIG. 20 is a circuit diagram showing a conventional one-transistor ferroelectric memory having memory cells formed by MFMIS-FETs, and FIG. 21 is a sectional view showing the one-transistor ferroelectric memory shown in FIG. 20. Referring to FIGS. 20 and 21, a well region 302 is formed on the surface of a semiconductor substrate 301 in the one-transistor ferroelectric memory. Source regions 303 and a drain region 304 are formed on the surface of the well region 302 at prescribed intervals. Gate electrodes 306 are formed on channel regions located between the source regions 303 and the drain region 304 through gate insulator films 305.

Word lines ($WL_0$ and $WL_1$) 308 are formed on the gate electrodes 306 through ferroelectric layers 307. A bit line ($BL_0$) 310 is electrically connected to the drain region 304. Plate lines ($PL_0$ and $PL_1$) 311 are connected to the source regions 303. A source line (SL) 312 is connected to the well region 302. The gate electrodes 306, the ferroelectric layers 307 and the word lines 308 form ferroelectric capacitors 315. The source regions 303, the drain region 304, the gate insulator films 305 and the gate electrodes 306 form transistors 309. In this case, each memory cell 300 has a structure obtained by forming each ferroelectric capacitor 315 on a gate portion of each transistor 309.

FIG. 22 is an equivalent circuit diagram of the one-transistor ferroelectric memory shown in FIGS. 20 and 21 in writing. When writing is performed similarly to that in the simple matrix ferroelectric memory shown in FIGS. 17 and 18 by unidirectionally continuously applying a voltage of ½ Vcc or ⅓ Vcc to non-selected cells, therefore, information (quantity of charges) is disadvantageously lost by the so-called disturbance.

SUMMARY OF THE INVENTION

An object of the present invention is to provide a ferroelectric memory capable of improving disturbance resistance in a non-selected memory cell.

Another object of the present invention is to put a simple matrix ferroelectric memory into practice by improving disturbance resistance in a non-selected memory cell.

Still another object of the present invention is to improve disturbance resistance in a non-selected memory cell in a one-transistor ferroelectric memory.

A ferroelectric memory according to a first aspect of the present invention comprises a bit line, a word line arranged to intersect with the bit line and a memory cell including a switching element arranged between the bit line and the word line and turned on with a threshold voltage having a substantially identical absolute value with respect to either of positive and negative voltage application directions and a ferroelectric capacitor arranged between the bit line and the word line and serially connected to the switching element.

In the ferroelectric memory according to the first aspect, the switching element turned on with a threshold voltage having a substantially identical absolute value with respect to either of positive and negative voltage application directions is serially connected to the ferroelectric capacitor as hereinabove described, whereby the ratio between voltages applied to the ferroelectric capacitor of a selected cell and the ferroelectric capacitor of a non-selected cell can be increased so that disturbance resistance of the non-selected cell can be improved in a simple matrix ferroelectric memory.

The aforementioned ferroelectric memory according to the first aspect preferably further comprises pulse application means for applying a pulse having a prescribed pulse width causing polarization inversion when a high voltage is applied to the ferroelectric capacitor while causing substantially no polarization inversion when a low voltage is applied to the ferroelectric capacitor to the memory cell, for applying a pulse of a high voltage having the aforementioned prescribed pulse width to a selected memory cell while applying a pulse of a low voltage having the aforementioned prescribed pulse width to a non-selected memory cell at least either in data writing or in data reading. According to this structure, data can be written in or read from the selected memory cell while causing substantially no polarization inversion in the non-selected memory cell. Consequently, the disturbance resistance of the non-selected memory cell can be further improved.

In the aforementioned ferroelectric memory according to the first aspect, the switching element preferably includes a bidirectional diode. According to this structure, the switching element turned on with a threshold voltage having a substantially identical absolute value with respect to either of positive and negative voltage application directions can be implemented.

In the aforementioned structure having the switching element including the bidirectional diode, the bidirectional diode may include a Schottky diode. According to this structure, the switching element turned on with a threshold voltage having a substantially identical absolute value with respect to either of positive and negative voltage application directions can be easily implemented. In this case, the Schottky diode is preferably formed by joining a conductive layer and a semiconductor layer to each other, the conductive layer preferably contains a metal and silicon, and the metal preferably includes at least one metal selected from a group consisting of Ir, Pt, Ru, Re, Ni, Co and Mo. According to this structure, a thermally stable Schottky barrier can be formed. Preferably, the Schottky diode is formed by joining a conductive layer and a semiconductor layer to each other, the conductive layer contains a metal, nitrogen and silicon, and the metal includes at least one metal selected from a group consisting of Ir, Pt, Ru, Re, Ni, Co and Mo. A thermally stable Schottky barrier can be formed also according to this structure.

In the aforementioned structure having the switching element including the bidirectional diode, the bidirectional diode may include a p-n diode formed by joining a p-type semiconductor layer and an n-type semiconductor layer to each other. According to this structure, the switching element turned on with a threshold voltage having a substantially identical absolute value with respect to either of positive and negative voltage application directions can be easily implemented. In this case, the p-type semiconductor layer and the n-type semiconductor layer forming the p-n diode may be formed by amorphous layers. According to this structure, a fine p-n diode can be homogeneously prepared.

In the aforementioned ferroelectric memory according to the first aspect, the switching element preferably includes an MIM capacitor utilizing a tunnel current. According to this structure, the switching element turned on with a threshold voltage having a substantially identical absolute value with respect to either of positive and negative voltage application directions can be implemented.

A ferroelectric memory according to a second aspect of the present invention comprises a memory cell including a ferroelectric capacitor connected to a gate portion of a field-effect transistor and a switching element serially connected to the ferroelectric capacitor and turned on with a threshold voltage having a substantially identical absolute value with respect to either of positive and negative voltage application directions.

In the ferroelectric memory according to the second aspect, as hereinabove described, the switching element serially connected to the ferroelectric capacitor and turned on with a threshold voltage having a substantially identical absolute value with respect to either of positive and negative voltage application directions is so provided that the ratio between voltages applied to the ferroelectric capacitor of a selected cell and the ferroelectric capacitor of a non-selected cell can be increased, whereby disturbance resistance of the non-selected cell can be improved in a one-transistor ferroelectric memory such as an MFIS-FET or MFMIS-FET ferroelectric memory.

The aforementioned ferroelectric memory according to the second aspect preferably further comprises pulse application means for applying a pulse having a prescribed pulse width causing polarization inversion when a high voltage is applied to the ferroelectric capacitor while causing substantially no polarization inversion when a low voltage is applied to the ferroelectric capacitor to the memory cell, for applying a pulse of a high voltage having the aforementioned prescribed pulse width to a selected memory cell while applying a pulse of a low voltage having the aforementioned prescribed pulse width to a non-selected memory cell at least either in data writing or in data reading. According to this structure, data can be written in or read from the selected memory cell while causing substantially no polarization inversion in the non-selected memory cell. Consequently, the disturbance resistance of the non-selected memory cell can be further improved.

In the aforementioned ferroelectric memory according to the second aspect, the switching element preferably includes a bidirectional diode. According to this structure, the switching element turned on with a threshold voltage having a substantially identical absolute value with respect to either of positive and negative voltage application directions can be implemented.

In the aforementioned structure having the switching element including the bidirectional diode, the bidirectional diode may include a Schottky diode. According to this structure, the switching element turned on with a threshold voltage having a substantially identical absolute value with respect to either of positive and negative voltage application directions can be easily implemented. In this case, the Schottky diode is preferably formed by joining a conductive layer and a semiconductor layer to each other, the conductive layer preferably contains a metal and silicon, and the metal preferably includes at least one metal selected from a group consisting of Ir, Pt, Ru, Re, Ni, Co and Mo. According to this structure, a thermally stable Schottky barrier can be formed. Preferably, the Schottky diode is formed by joining a conductive layer and a semiconductor layer to each other, the conductive layer contains a metal, nitrogen and silicon, and the metal includes at least one metal selected from a group consisting of Ir, Pt, Ru, Re, Ni, Co and Mo. A thermally stable Schottky barrier can be formed also according to this structure.

In the aforementioned structure having the switching element including the bidirectional diode, the bidirectional diode may include a p-n diode formed by joining a p-type semiconductor layer and an n-type semiconductor layer to each other. According to this structure, the switching element turned on with a threshold voltage having a substantially identical absolute value with respect to either of positive and negative voltage application directions can be easily implemented. In this case, the p-type semiconductor layer and the n-type semiconductor layer forming the p-n diode may be formed by amorphous layers. According to this structure, a fine p-n diode can be homogeneously prepared.

In the aforementioned ferroelectric memory according to the second aspect, the switching element preferably includes an MIM capacitor utilizing a tunnel current. According to this structure, the switching element turned on with a threshold voltage having a substantially identical absolute value with respect to either of positive and negative voltage application directions can be implemented.

A method of operating a ferroelectric memory according to a third aspect of the present invention is employed for operating a ferroelectric memory comprising a bit line, a word line arranged to intersect with the bit line, a memory cell including a switching element arranged between the bit line and the word line and turned on with a threshold voltage having a substantially identical absolute value with respect to either of positive and negative voltage application directions and a ferroelectric capacitor arranged between the bit line and the word line and serially connected to the switching element and pulse application means for applying a pulse having a prescribed pulse width causing polarization inversion when a high voltage is applied to the ferroelectric capacitor while causing substantially no polarization inversion when a low voltage is applied to the ferroelectric capacitor to the memory cell by applying a pulse of a high voltage having the prescribed pulse width to a selected memory cell while applying a pulse of a low voltage having the prescribed pulse width to a non-selected memory cell at least either in data writing or in data reading.

The method of operating a ferroelectric memory according to the third aspect can increase the ratio between voltages applied to the ferroelectric capacitors of the selected and non-selected cells while causing substantially no polarization inversion on the ferroelectric capacitor of the non-selected cell due to the aforementioned structure. Thus, the non-selected cell can be improved in disturbance resistance.

A method of operating a ferroelectric memory according to a fourth aspect of the present invention is employed for operating a ferroelectric memory comprising a memory cell including a ferroelectric capacitor connected to a gate portion of a field-effect transistor and a switching element serially connected to the ferroelectric capacitor and turned on with a threshold voltage having a substantially identical absolute value with respect to either of positive and negative voltage application directions and pulse application means for applying a pulse having a prescribed pulse width causing polarization inversion when a high voltage is applied to the ferroelectric capacitor while causing substantially no polarization inversion when a low voltage is applied to the ferroelectric capacitor to the memory cell by applying a pulse of a high voltage having the prescribed pulse width to a selected memory cell while applying a pulse of a low voltage having the prescribed pulse width to a non-selected memory cell at least either in data writing or in data reading.

The aforementioned method of operating a ferroelectric memory according to the fourth aspect can increase the ratio between voltages applied to the ferroelectric capacitors of the selected and non-selected cells while causing substantially no polarization inversion on the ferroelectric capacitor of the non-selected cell due to the aforementioned structure. Thus, the non-selected cell can be improved in disturbance resistance.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a diagram for illustrating an effect of the ferroelectric memory according to the third embodiment of the present invention;

DESCRIPTION OF THE PREFERRED EMBODIMENTS

Embodiments of the present invention are now described with reference to the drawings.

(First Embodiment)

Figure 1:
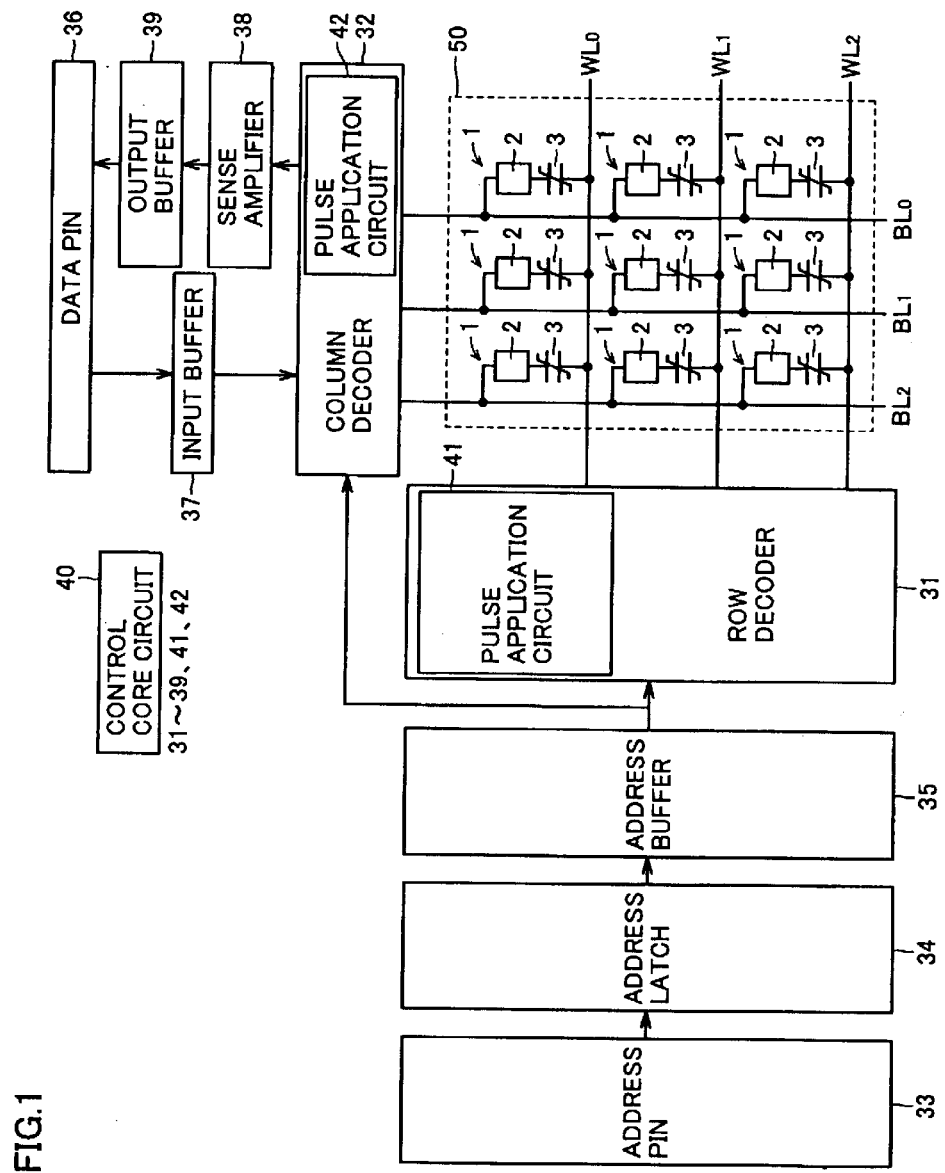
FIG. 1 is a circuit diagram showing the overall structure of a ferroelectric memory according to a first embodiment of the present invention.

The overall structure of a simple matrix ferroelectric memory according to a first embodiment of the present invention is described with reference to FIGS. 1 and 2. In the ferroelectric memory according to the first embodiment, a memory cell array 50 is formed by arranging a plurality of memory cells 1 in the form of a matrix (FIG. 1 shows only nine memory cells 1 for the convenience of illustration). Ferroelectric capacitors 3 forming the memory cells 1 have first terminals connected to word lines $WL_0$ to $WL_2$ and second terminals connected to first terminals of switching elements 2. Second terminals of the switching elements 2 are connected to bit lines $BL_0$ to $BL_2$. In other words, the memory cells 1 are formed by the switching elements 2 and the ferroelectric capacitors 3 in the ferroelectric memory according to the first embodiment. The switching elements 2 are described later in detail.

The word lines $WL_0$ to $WL_2$ are connected to a row decoder 31. The bit lines $BL_0$ to $BL_2$ are connected to a column decoder 32.

Externally specified row and column addresses are input in an address pin 33, and transferred to an address latch 34 from the address pin 33. In the addresses latched in the address latch 34, the row address is transferred to the row decoder 31 through an address buffer 35, and the column address is transferred to the column decoder 32 through the address buffer 35.

The row decoder 31 selects a word line corresponding to the row address latched in the address latch 34 from the word lines $WL_0$ to $WL_2$, and controls the potentials of the word lines $WL_0$ to $WL_2$ in response to an operation mode.

The column decoder 32 selects a bit line corresponding to the column address latched in the address latch 34 from the bit lines $BL_0$ to $BL_2$, and controls the potentials of the bit lines $BL_0$ to $BL_2$ in response to the operation mode.

According to the first embodiment, the row decoder 31 and the column decoder 32 include pulse application circuits 41 and 42 respectively. Each of the pulse application circuits 41 and 42 applies a pulse having a prescribed pulse width causing sufficient polarization inversion when a high voltage is applied to each ferroelectric capacitor 3 while causing substantially no polarization inversion when a low voltage is applied to each ferroelectric capacitor 3 to each memory cell 1. The pulse application circuits 41 and 42 are examples of the "pulse application means" in the present invention.

Externally specified data is input in a data pin 36, and transferred to the column decoder 32 from the data pin 36 through an input buffer 37. The column decoder 32 controls the potentials of the bit lines $BL_0$ to $BL_2$ in correspondence to the data.

Data read from an arbitrary memory cell 1 is transferred to a sense amplifier 38 from any of the bit lines $BL_0$ to $BL_2$ through the column decoder 32. The sense amplifier 38 is a voltage sense amplifier or a current sense amplifier. The data determined by the sense amplifier 38 is output from an output buffer 39 through the data pin 36.

A control core circuit 40 controls the operations of the aforementioned circuits 31 to 39, 41 and 42.

Figures 2, 3:
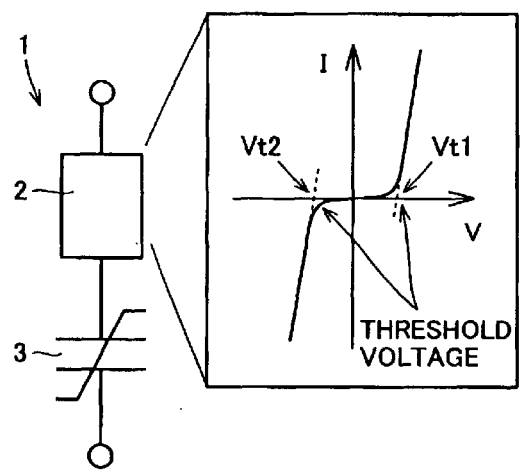
FIG. 2 is a schematic diagram for illustrating a memory cell structure of the ferroelectric memory according to the first embodiment shown in FIG. 1.
FIG. 3 is a diagram for illustrating an effect of the ferroelectric memory according to the first embodiment of the present invention.

As shown in FIG. 2, each switching element 2 according to the first embodiment is turned on with threshold voltages Vt1 and Vt2 having substantially identical absolute values with respect to either of positive and negative voltage application directions. According to the first embodiment, the switching element 2 consists of a bidirectional diode. This diode is turned on with the positive and negative threshold voltages Vt1 and Vt2 having absolute values |Vt1| and |Vt2| substantially equal to each other. When a positive voltage is applied to each memory cell 1, a voltage of a level obtained by subtracting the threshold voltage of the diode forming the switching element 2 from the applied voltage is applied to the ferroelectric capacitor 3. For example, it is assumed that the threshold voltage of the diode is 0.8 V, the saturation voltage of the ferroelectric capacitor 3 is 2.0 V and a power supply voltage Vcc is 2.8 V. When a ½ Vcc method is employed in this case, a voltage of 2.8−0.8=2.0 V is applied to the ferroelectric capacitor 3 of a selected memory cell 1 and a voltage of 2.8/2−0.8=0.6 V is applied to the ferroelectric capacitor 3 of a non-selected memory cell 1, as shown in FIG. 3.

When a voltage of 2.0 V (Vcc=2.0 V) is applied to a ferroelectric capacitor of a selected memory cell in a conventional simple matrix ferroelectric memory having memory cells each formed by only a single ferroelectric capacitor, it follows that a voltage of 1.0 V is applied to the ferroelectric capacitor of a non-selected memory cell.

Figure 4:
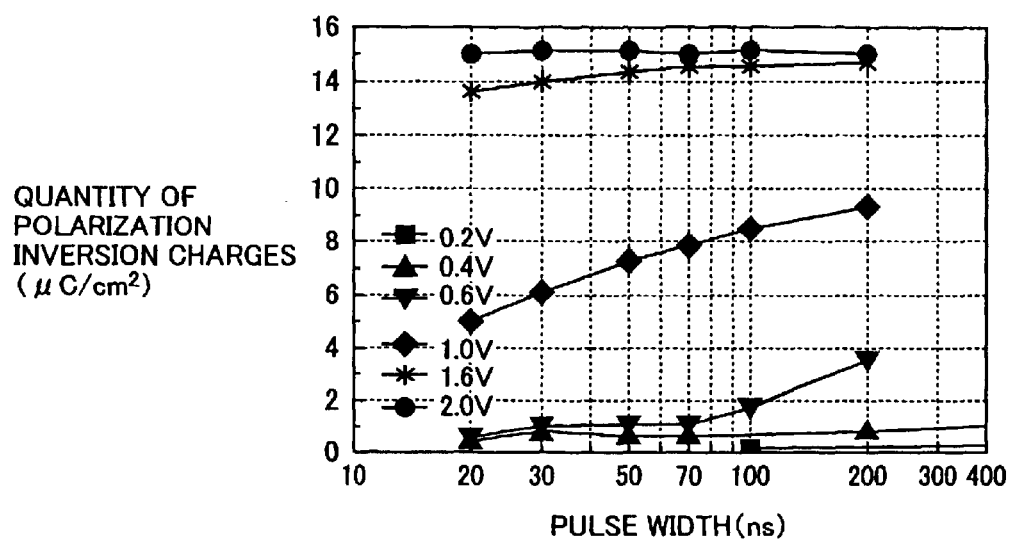
FIG. 4 illustrates pulse response characteristics of a ferroelectric layer of the ferroelectric memory according to the first embodiment of the present invention in relation to the quantity of polarization inversion charges.

FIG. 4 shows exemplary relation between pulse widths and quantities of polarization inversion charges with parameters of applied voltages in a case of applying pulses to a ferroelectric capacitor employing an SBT ($Sr_{0.9}Bi_{2.2}Ta_2O_9$) film as a ferroelectric layer. When the pulse width is not more than 70 ns and the applied voltage is at a high level of at least 1.6 V, for example, the quantity of polarization inversion is substantially saturated to exhibit a quantity of charges of 14 to 15 $\mu C/cm^2$, as clearly understood from FIG. 4. It is also understood that substantially no polarization inversion is caused when the applied voltage is at a low level of not more than 0.6 V, for example. Thus, it is understood that the ferroelectric layer causes polarization inversion under a high voltage while causing substantially no polarization inversion under a low voltage when the pulse width is relatively short. When a high voltage pulse is applied to a selected cell and a low voltage pulse is applied to a non-selected cell, therefore, data can be written in the ferroelectric layer of the selected cell while keeping the ferroelectric layer of the non-selected cell substantially unchanged in molecular structure.

When ferroelectric capacitors are formed by SBT films having the pulse response characteristics shown in FIG. 4, the ferroelectric memory is set to apply a voltage of 2.0 V having a pulse width of 30 ns to the ferroelectric capacitor of a selected cell. In this case, a voltage of 1.0 V is applied to the ferroelectric capacitor of a non-selected cell in the conventional cell structure to cause polarization inversion of 6.0 $\mu C/cm^2$ in quantity, leading to disturbance. According to the first embodiment, only the voltage of 0.6 V is applied to the ferroelectric capacitor 3 of the non-selected memory cell 1, which hardly causes polarization inversion (only 1.0 $\mu C/cm^2$ in quantity). In the ferroelectric memory according to the first embodiment, as hereinabove described, the voltage applied to the non-selected memory cell 1 can be reduced as compared with that applied to the conventional memory cell formed by only the ferroelectric capacitor, whereby the non-selected memory cell 1 can consequently be improved in disturbance resistance.

Also when a voltage is applied in a negative direction, the switching element 2 consisting of a bidirectional diode and the ferroelectric capacitor 3 are substantially symmetric with respect to the applied voltage and hence an effect substantially similar to the above is attained also in relation to the voltage applied to the ferroelectric capacitor 3.

Figure 5:
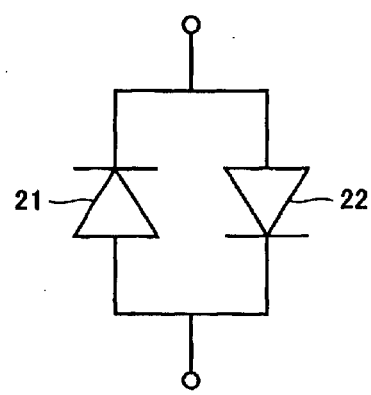
FIG. 5 is a circuit diagram showing an exemplary switching element of the ferroelectric memory according to the first embodiment of the present invention.
Figure 6:
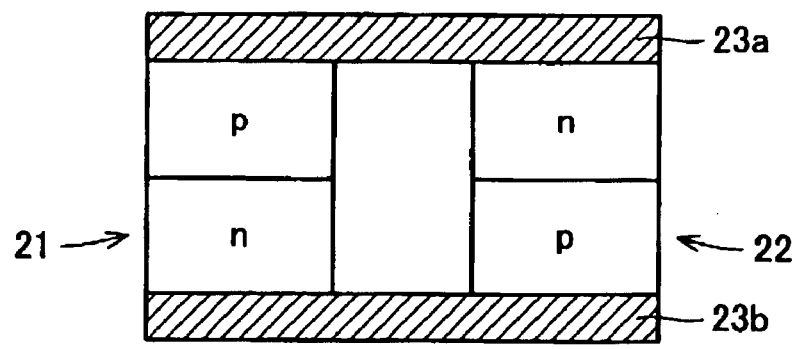
FIG. 6 is a sectional view corresponding to the circuit diagram of the switching element according to the first embodiment shown in FIG. 5.
Figure 7:
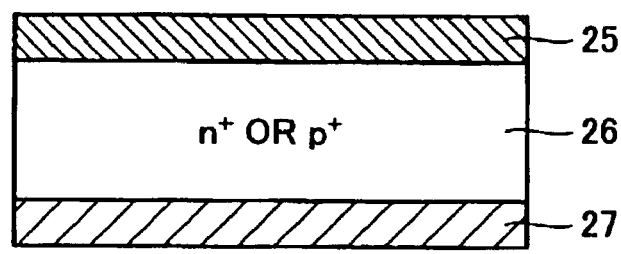
FIG. 7 is a sectional view showing another exemplary switching element of the ferroelectric memory according to the first embodiment of the present invention.

The bidirectional diode forming the switching element 2 according to the first embodiment can be prepared from p-n diodes 21 and 22 shown in FIGS. 5 and 6 or a Schottky diode formed by joining a conductive layer 25 and a high-concentration $n^+$ or $p^+$ semiconductor layer 26 to each other as shown in FIG. 7. As shown in FIG. 6, the p-n diodes 21 and 22 are held between two electrodes 23a and 23b. As shown in FIG. 7, an electrode 27 is formed on a surface of the semiconductor layer 26 forming the Schottky diode.

The p-n diodes or the Schottky diode can be formed by a polycrystalline semiconductor layer or an amorphous semiconductor layer. In particular, the amorphous semiconductor layer having no grain boundary can attain homogeneous diode characteristics with a fine structure. The amorphous semiconductor layer can be prepared from amorphous Si or the like.

Figure 8:
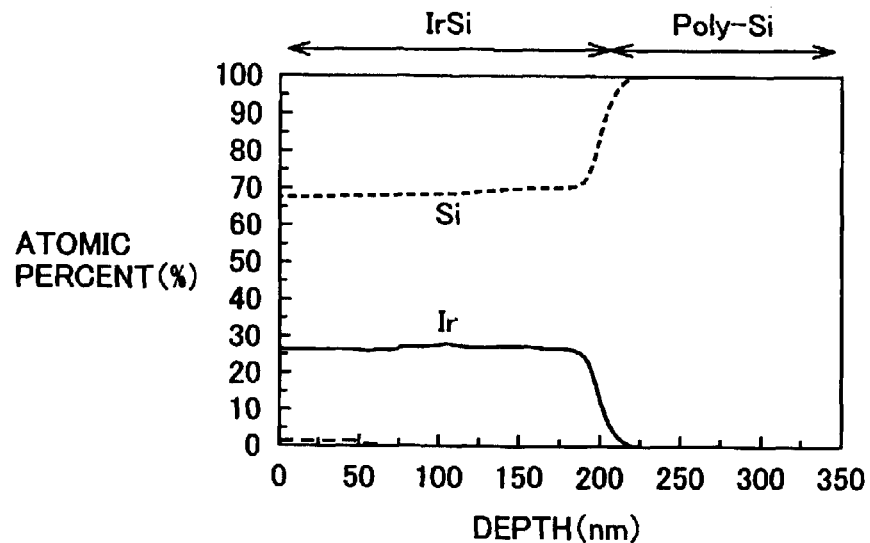
FIGS. 8 and 9 are correlation diagrams for illustrating thermal stability of the switching element according to the first embodiment formed by a Schottky barrier.
Figure 9:
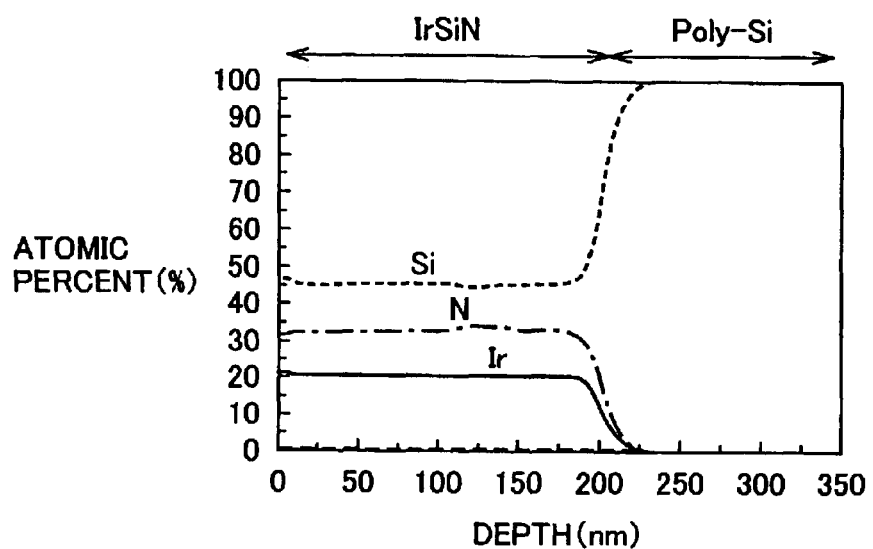

The Schottky diode must be thermally stable, not to exhibit ohmic characteristics by interdiffusion on the interface between the conductive layer 25 and the semiconductor layer 26 in a semiconductor element fabrication step. FIGS. 8 and 9 show profiles of compositions of an IrSi/polysilicon sample and an IrSiN/polysilicon sample heat-treated at 800° C. along depth directions respectively. It is clearly understood from FIGS. 8 and 9 that no remarkable interdiffusion appears on the interfaces between IrSi and polysilicon and between IrSiN and polysilicon but IrSi and IrSiN forming conductive layers and polysilicon forming semiconductor layers are thermally stably joined to each other.

Such thermally stable junction can also be attained by a conductive material containing at least one of Ir, Pt, Ru, Re, Ni, Co and Mo and silicon or a conductive material containing at least one of Ir, Pt, Ru, Re, Ni, Co and Mo, silicon and nitrogen.

(Second Embodiment)

While the aforementioned first embodiment employs the ½ Vcc method, a ferroelectric memory according to a second embodiment of the present invention employs a ⅓ Vcc method.

Each memory cell 1 of the ferroelectric memory according to the second embodiment is similar in structure to that of the ferroelectric memory according to the first embodiment. More specifically, the memory cell 1 is formed by a switching element 2 turned on with a substantially identical threshold voltage (absolute value) with respect to either of positive and negative voltage application directions and a ferroelectric capacitor 3 serially connected to the switching element 2.

Figure 10:
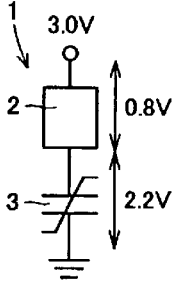
FIG. 10 is a diagram for illustrating an effect of a ferroelectric memory according to a second embodiment of the present invention.
Figure 10:
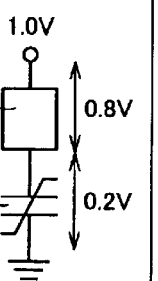
Figure 10:
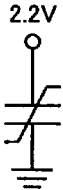
Figure 10:
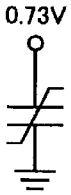

According to the second embodiment, the threshold voltage of a bidirectional diode forming the switching element 2 is set to 0.8 V, the saturation voltage of the ferroelectric capacitor 3 is set to 2.2 V, and a power supply voltage Vcc is set to 3.0 V, as shown in FIG. 10. When the ⅓ Vcc method is employed, a voltage of 3.0−0.8=2.2 V is applied to a selected memory cell 1 while a voltage of 3.0/3−0.8=0.2 V is applied to a non-selected memory cell 1, as shown in FIG. 10. In other words, the voltage applied to the non-selected cell 1 is smaller than one third of that applied to the selected memory cell 1. In the conventional cell structure, a voltage of 2.2 V is applied to the ferroelectric capacitor of a selected cell and a voltage of 0.73 V, i.e., one third of 2.2 V, is applied to the ferroelectric capacitor of a non-selected cell.

When the ferroelectric capacitor 3 is formed by an SBT film having pulse response characteristics similar to those shown in FIG. 4 in relation to the quantity of polarization inversion similarly to that in the first embodiment, the ferroelectric memory is set to apply a voltage of 2.2 V having a pulse width of 30 ns to the ferroelectric capacitor 3 of the selected memory cell 1. In this case, a voltage of 0.2 V is applied to the non-selected memory cell 1, which hardly causes polarization inversion (not more than 0.5 $\mu C/cm^2$ in quantity). According to the ⅓ Vcc method, therefore, the voltage applied to the non-selected memory cell 1 can be further reduced as compared with that according to the ½ Vcc method employed in the first embodiment, whereby disturbance resistance of the non-selected memory cell 1 can be further improved.

(Third Embodiment)

Figure 11:
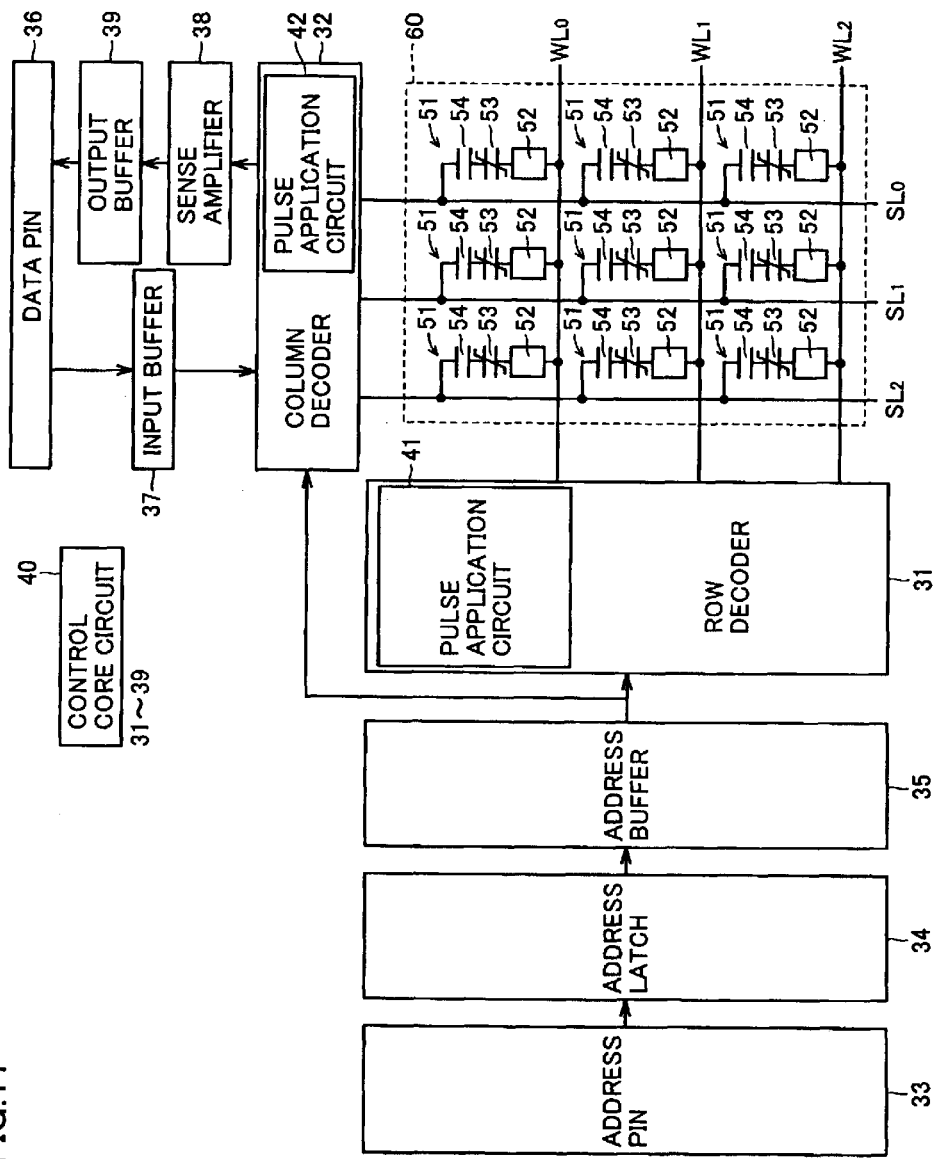
FIG. 11 is a circuit diagram showing the overall structure of a ferroelectric memory according to a third embodiment of the present invention.
Figure 13:
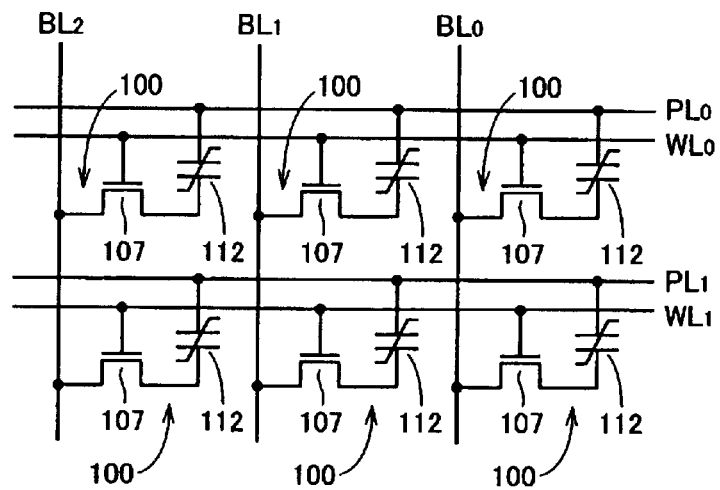
FIG. 13 is a circuit diagram showing the circuit structure of a memory cell array of a most general conventional ferroelectric memory.
Figure 14:
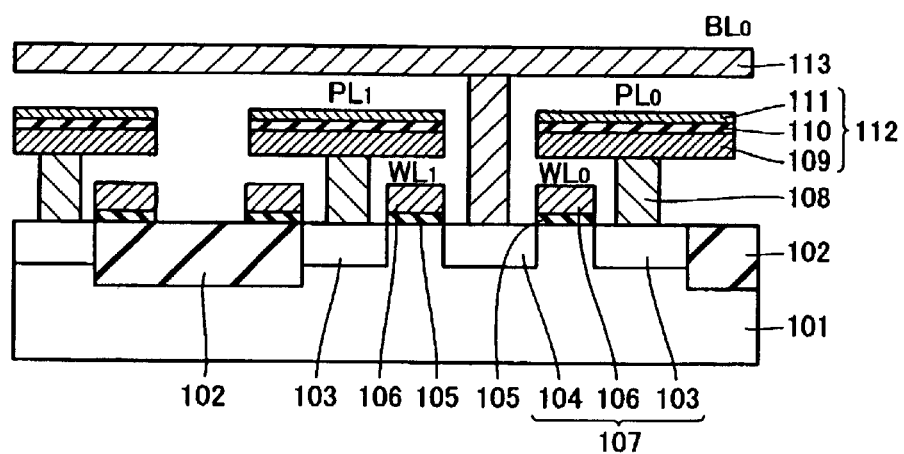
FIG. 14 is a sectional view corresponding to the circuit diagram shown in FIG. 13.
Figure 15:
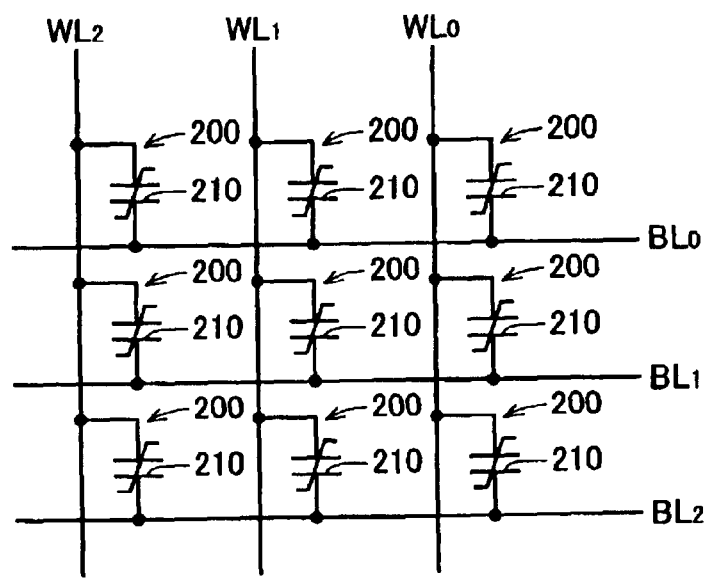
FIG. 15 is a circuit diagram showing the circuit structure of a memory cell array of a conventional simple matrix ferroelectric memory.
Figure 16:
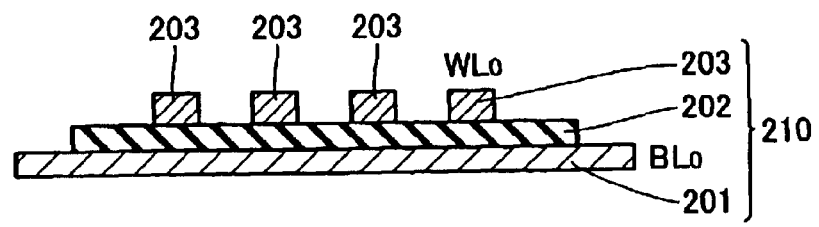
FIG. 16 is a sectional view of the conventional simple matrix ferroelectric memory shown in FIG. 15.
Figure 17:
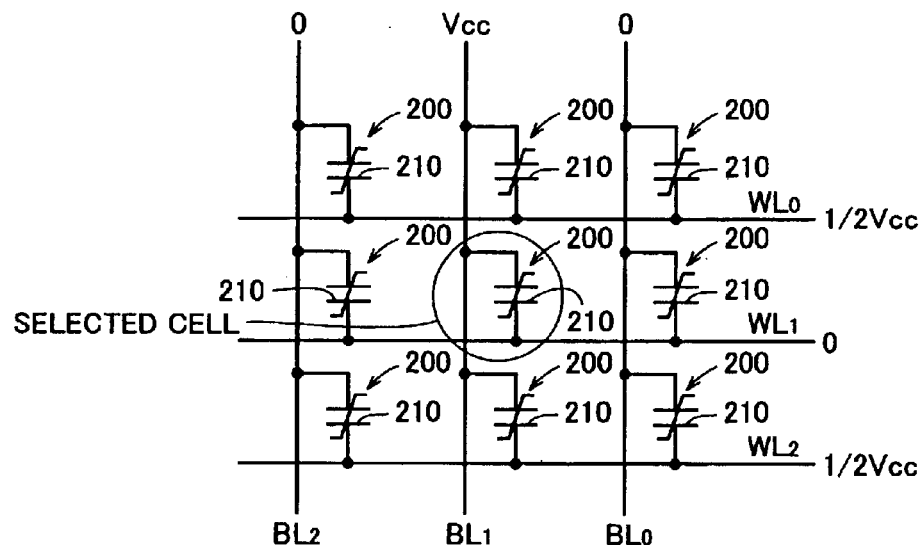
FIG. 17 is a circuit diagram for illustrating a voltage application state according to a ½ Vcc method in a write operation of the conventional simple matrix ferroelectric memory shown in FIGS. 15 and 16.
Figure 18:
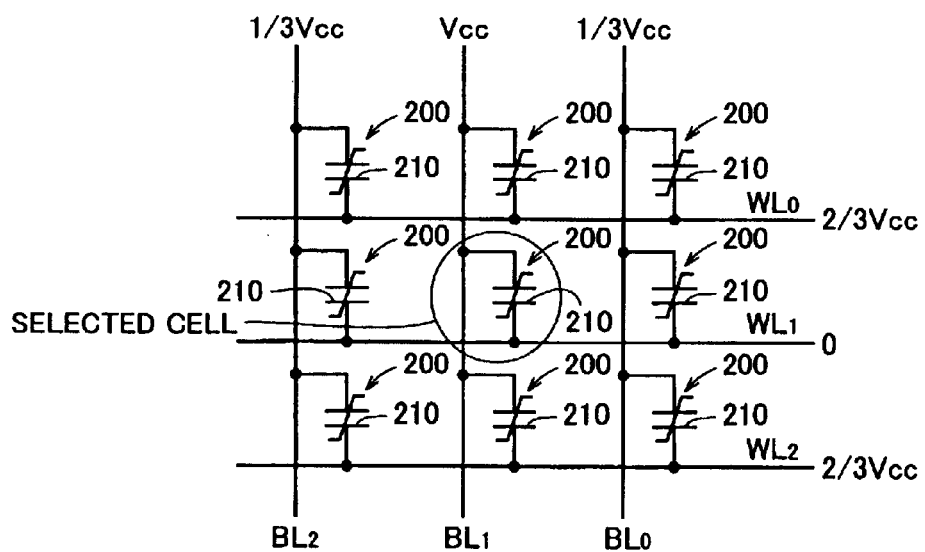
FIG. 18 is a circuit diagram for illustrating a voltage application state according to a ⅓ Vcc method in a write operation of the conventional simple matrix ferroelectric memory shown in FIGS. 15 and 16.
Figure 19:
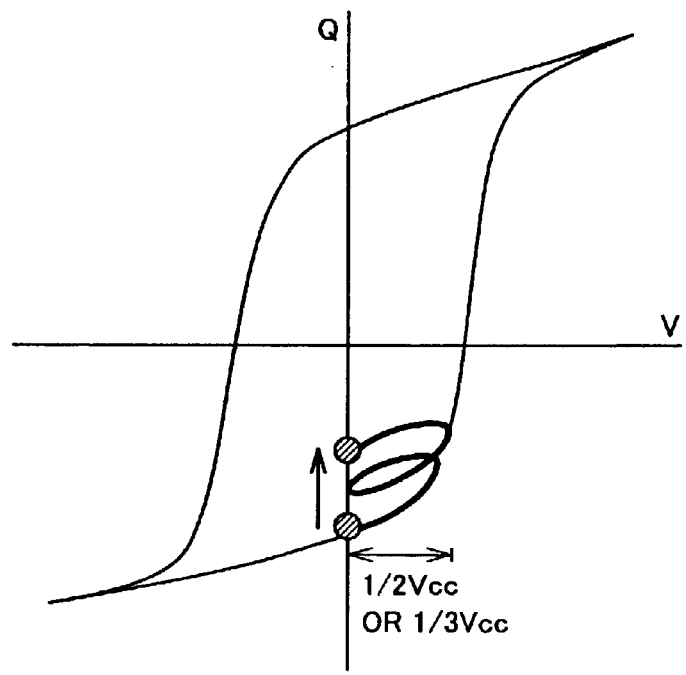
FIG. 19 shows ferroelectric hysteresis for illustrating a problem of the conventional simple matrix ferroelectric memory.
Figure 20:
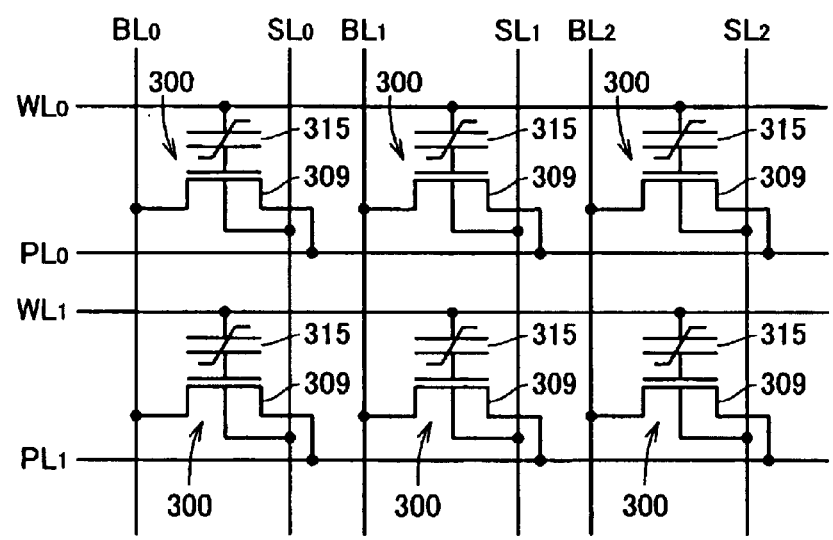
FIG. 20 is a circuit diagram of a memory cell array of a conventional one-transistor ferroelectric memory employing MFMIS-FETs.
Figure 21:
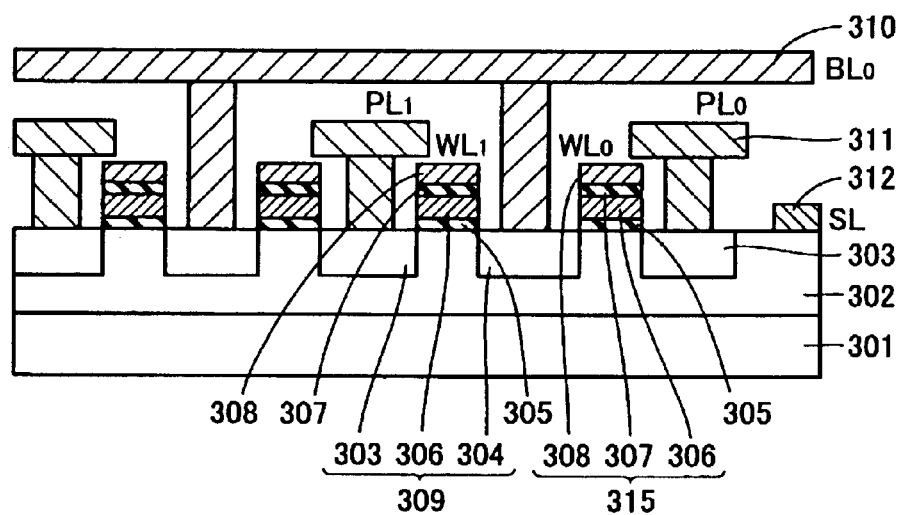
FIG. 21 is a sectional view of the conventional one-transistor ferroelectric memory employing MFMIS-FETs shown in FIG. 20.
Figure 22:
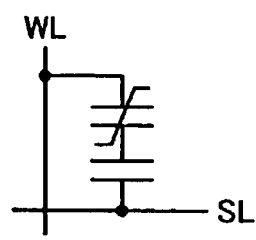
FIG. 22 is an equivalent circuit diagram of the conventional one-transistor ferroelectric memory employing MFMIS-FETs shown in FIGS. 20 and 21 in a write operation.

FIG. 11 is a circuit diagram of a one-transistor ferroelectric memory according to a third embodiment of the present invention. In an equivalent circuit in writing similar to that of the one-transistor ferroelectric memory employing MFMIS-FETs shown in FIG. 22, each memory cell 51 of the one-transistor ferroelectric memory according to the third embodiment is formed by serially connecting a switching element 52 to a ferroelectric capacitor 53 serially connected with a paraelectric capacitor 54 as shown in FIG. 11.

In this case, a voltage applied to the ferroelectric capacitor 53 is in inverse proportion to the capacitance ratio between the ferroelectric capacitor 53 and the paraelectric capacitor 54. When the ratio of the capacitance of the ferroelectric capacitor 53 to the capacitance of the paraelectric capacitor 54 is 1:2, for example, it follows that a voltage corresponding to two thirds of the applied voltage is applied to the ferroelectric capacitor 53. It is assumed that the threshold voltage of a diode is 0.8 V, the saturation voltage of a ferroelectric substance forming a gate portion is 2.0 V and a power supply voltage Vcc is 3.8 V. When the ⅓ Vcc method is employed in this case, a voltage of $(3.8-0.8) \times \frac{2}{3} = 2.0$ V is applied to a selected memory cell 51 and a voltage of $(3.8/3-0.8) \times \frac{2}{3} = 0.31$ V is applied to a non-selected memory cell 51, as shown in FIG. 12. Therefore, the voltage applied to the non-selected memory cell 51 is smaller than one third of that applied to the selected memory cell 51. In the conventional memory cell shown in FIG. 22, a voltage of 2.0 V is applied to the ferroelectric capacitor of a selected memory cell and a voltage of 0.67 V, i.e., one third of 2.0 V, is applied to the ferroelectric capacitor of a non-selected cell.

When the ferroelectric capacitor 53 is formed by an SBT film having pulse response characteristics similar to those shown in FIG. 4 also in the third embodiment, the ferroelectric memory is set to apply a voltage of 2.0 V having a pulse width of 30 ns to the ferroelectric capacitor 53 of a selected cell 51. It is understood that a non-selected memory cell 51 hardly causes polarization inversion (not more than 1.0 μC/cm² in quantity). According to the third embodiment, therefore, disturbance resistance of the non-selected memory cell 51 can be effectively improved in a write operation of the one-transistor ferroelectric memory.

Although the present invention has been described and illustrated in detail, it is clearly understood that the same is by way of illustration and example only and is not to be taken by way of limitation, the spirit and scope of the present invention being limited only by the terms of the appended claims.

For example, while the switching element turned on with a substantially identical threshold voltage (absolute value) with respect to either of positive and negative voltage application directions is formed by a bidirectional diode in each of the aforementioned embodiments, the present invention is not restricted to this but the switching element may alternatively consist of an MIM capacitor utilizing a tunnel current or the like.

While the ferroelectric layer is formed by an SBT film in each of the aforementioned embodiments, the present invention is not restricted to this but the ferroelectric layer may alternatively be prepared from SBNT ($SrBi_2(Ta,Nb)_2O_9$), PZT ($Pb(Zr,Ti)O_3$), PLZT ($(Pb,La)(Zr,Ti)O_3$), BLT ($(Bi,La)_4Ti_3O_{12}$) or a similar material. In other words, the ferroelectric layer can be prepared from any material having a polarization inversion characteristic presenting a pulse width causing sufficient polarization inversion when receiving a high voltage while hardly causing polarization inversion when receiving a low voltage as shown in FIG. 4.

While the aforementioned third embodiment is applied to a one-transistor ferroelectric memory employing MFMIS-FETs, the present invention is not restricted to this but is also applicable to a one-transistor ferroelectric memory employing MFIS-FETs.

While each of the aforementioned first and second embodiments is applied to writing, the present invention is not restricted to this but is also applicable to reading. In reading, for example, all bit lines BL and all word lines WL are set to 0 V in an initial state. A bit line BL connected to a selected cell is brought into a floating state and a power supply voltage Vcc is applied to the word line WL connected to the selected cell for reading data. Voltages of ½ Vcc and 0 V are applied to the remaining bit lines BL and the remaining word lines WL respectively according to the ½ Vcc method, or voltages of ⅔ Vcc and ⅓ Vcc are applied to the remaining bit lines BL and the remaining word lines WL respectively according to the ⅓ Vcc method. Thus, disturbance can be inhibited also in reading, similarly to that in writing.

While the aforementioned third embodiment is applied to writing, the present invention is not restricted to this but is also applicable to reading. In reading, a word line WL connected to a selected cell is set to a voltage $V_R$ and a source line SL connected to the selected cell is set to 0 V for applying a voltage between a bit line BL and a plate line PL and reading the value of a current varying with held data. At this time, voltages of ½ $V_R$ and 0 V are applied to the remaining source lines SL and the remaining word lines WL respectively according to the ½ Vcc method, or voltages of ⅔ $V_R$ and ⅓ $V_R$ are applied to the remaining source lines SL and the remaining word lines WL respectively according to the ⅓ Vcc method, while applying voltages to the remaining bit lines BL and the remaining plate lines PL to cause no potential difference therebetween. Thus, disturbance can be inhibited also in reading similarly to that in writing.

What is claimed is:

1. A ferroelectric memory comprising:

a bit line;

a word line arranged to intersect with said bit line; and a memory cell including:

a switching element arranged between said bit line and said word line and turned on with a threshold voltage having a substantially identical absolute value with respect to either of positive and negative voltage application directions, and a ferroelectric capacitor arranged between said bit line and said word line and serially connected to said switching element, pulse application means for applying a pulse having a prescribed pulse width causing polarization inversion when a high voltage is applied to said ferroelectric capacitor while causing substantially no polarization inversion when a low voltage is applied to said ferroelectric capacitor of said memory cell, and for applying a high voltage pulse having said prescribed pulse width to selected said memory cell while applying a low voltage pulse having said prescribed pulse width to non-selected said memory cell at least either in data writing or in data reading.

2. The ferroelectric memory according to claim 1, wherein said switching element includes a bidirectional diode.

3. A ferroelectric memory comprising:

a bit line;

a word line arranged to intersect with said bit line; and a memory cell including:

a switching element arranged between said bit line and said word line and turned on with a threshold voltage having a substantially identical absolute value with respect to either of positive and negative voltage application directions, and a ferroelectric capacitor arranged between said bit line and said word line and serially connected to said switching element, wherein said switching element includes a bidirectional diode, and wherein said bidirectional diode includes a Schottky diode.

4. The ferroelectric memory according to claim 3, wherein said Schottky diode is formed by joining a conductive layer and a semiconductor layer to each other, and said conductive layer contains a metal and silicon while said metal includes at least one metal selected from a group consisting of Ir, Pt, Ru, Re, Ni, Co and Mo.

5. The ferroelectric memory according to claim 3, wherein said Schottky diode is formed by joining a conductive layer and a semiconductor layer to each other, and said conductive layer contains a metal, nitrogen and silicon while said metal includes at least one metal selected from a group consisting of Ir, Pt, Ru, Re, Ni, Co and Mo.

6. A ferroelectric memory comprising:

a bit line;

a word line arranged to intersect with said bit line; and a memory cell including:

a switching element arranged between said bit line and said word line and turned on with a threshold voltage having a substantially identical absolute value with respect to either of positive and negative voltage application directions, and a ferroelectric capacitor arranged between said bit line and said word line and serially connected to said switching element, wherein said switching element includes a bidirectional diode, and wherein said bidirectional diode includes a p-n diode formed by joining a p-type semiconductor layer and an n-type semiconductor layer to each other.

7. The ferroelectric memory according to claim 6, wherein said p-type semiconductor layer and said n-type semiconductor layer forming said p-n diode are formed by amorphous layers.

8. A ferroelectric memory comprising:

a bit line;

a word line arranged to intersect with said bit line; and a memory cell including:

a switching element arranged between said bit line and said word line and turned on with a threshold voltage having a substantially identical absolute value with respect to either of positive and negative voltage application directions, and a ferroelectric capacitor arranged between said bit line and said word line and serially connected to said switching element, wherein said switching element includes an MIM capacitor utilizing a tunnel current.

9. A ferroelectric memory comprising:

a memory cell including:

a ferroelectric capacitor connected to a gate portion of a field-effect transistor, and a switching element serially connected to said ferroelectric capacitor and turned on with a threshold voltage having a substantially identical absolute value with respect to either of positive and negative voltage application directions, pulse application means for applying a pulse having a prescribed pulse width causing polarization inversion when a high voltage is applied to said ferroelectric capacitor while causing substantially no polarization inversion when a low voltage is applied to said ferroelectric capacitor of said memory cell, and for applying a high voltage pulse having said prescribed pulse width to selected said memory cell while applying a low voltage pulse having said prescribed pulse width to non-selected said memory cell at least either in data writing or in data reading.

10. The ferroelectric memory according to claim 9, wherein said switching element includes a bidirectional diode.

11. A ferroelectric memory comprising:

a memory cell including:

a ferroelectric capacitor connected to a gate portion of a field-effect transistor, and a switching element serially connected to said ferroelectric capacitor and turned on with a threshold voltage having a substantially identical absolute value with respect to either of positive and negative voltage application directions, wherein said switching element includes a bidirectional diode, and wherein said bidirectional diode includes a Schottky diode.

12. The ferroelectric memory according to claim 11, wherein said Schottky diode is formed by joining a conductive layer and a semiconductor layer to each other, and said conductive layer contains a metal and silicon while said metal includes at least one metal selected from a group consisting of Ir, Pt, Ru, Re, Ni, Co and Mo.

13. The ferroelectric memory according to claim 11, wherein said Schottky diode is formed by joining a conductive layer and a semiconductor layer to each other, and said conductive layer contains a metal, nitrogen and silicon while said metal includes at least one metal selected from a group consisting of Ir, Pt, Ru, Re, Ni, Co and Mo.

14. A ferroelectric memory comprising:

a memory cell including:

a ferroelectric capacitor connected to a gate portion of a field-effect transistor, and a switching element serially connected to said ferroelectric capacitor and turned on with a threshold voltage having a substantially identical absolute value with respect to either of positive and negative voltage application directions, wherein said switching element includes a bidirectional diode, and wherein said bidirectional diode includes a p-n diode formed by joining a p-type semiconductor layer and an n-type semiconductor layer to each other.

15. The ferroelectric memory according to claim 14, wherein said p-type semiconductor layer and said n-type semiconductor layer forming said p-n diode are formed by amorphous layers.

16. A ferroelectric memory comprising:

a memory cell including:

a ferroelectric capacitor connected to a gate portion of a field-effect transistor, and a switching element serially connected to said ferroelectric capacitor and turned on with a threshold voltage having a substantially identical absolute value with respect to either of positive and negative voltage application directions, wherein said switching element includes an MIM capacitor utilizing a tunnel current.

17. A method of operating a ferroelectric memory, the ferroelectric memory comprising a bit line, a word line arranged to intersect with said bit line, a memory cell including a switching element arranged between said bit line and said word line and turned on with a threshold voltage having a substantially identical absolute value with respect to either of positive and negative voltage application directions, and a ferroelectric capacitor arranged between said bit line and said word line and serially connected to said switching element, and pulse application means, the method comprising the steps of:

applying a pulse having a prescribed pulse width causing polarization inversion when a high voltage is applied to said ferroelectric capacitor while causing substantially no polarization inversion when a low voltage is applied to said ferroelectric capacitor to said memory cell, and applying a high voltage pulse having said prescribed pulse width to selected said memory cell while applying a low voltage pulse having said prescribed pulse width to non-selected said memory cell at least either in data writing or in data reading.

18. A method of operating a ferroelectric memory, the ferroelectric memory comprising a memory cell including a ferroelectric capacitor connected to a gate portion of a field-effect transistor and a switching element serially connected to said ferroelectric capacitor and turned on with a threshold voltage having a substantially identical absolute value with respect to either of positive and negative voltage application directions, and pulse application means, the method comprising the steps of:

applying a pulse having a prescribed pulse width causing polarization inversion when a high voltage is applied to said ferroelectric capacitor while causing substantially no polarization inversion when a low voltage is applied to said ferroelectric capacitor of said memory cell, and applying a high voltage pulse having said prescribed pulse width to selected said memory cell while applying a low voltage pulse having said prescribed pulse width to non-selected said memory cell at least either in data writing or in data reading.

* * * * *